(12) United States Patent
Miura et al.

(10) Patent No.: US 6,565,650 B2
(45) Date of Patent: May 20, 2003

(54) SINGLE CRYSTAL PULLING APPARATUS AND PULLING METHOD

(75) Inventors: Hiroyuki Miura, Aichi (JP); Yasuyuki Iwata, Aichi (JP); Shinsuke Kondoh, Aichi (JP)

(73) Assignee: Toshiba Ceramics Co., Ltd., Tokyo (JP)

( * ) Notice: Subject to any disclaimer, the term of this patent is extended or adjusted under 35 U.S.C. 154(b) by 0 days.

(21) Appl. No.: 09/883,955

(22) Filed: Jun. 20, 2001

(65) Prior Publication Data

US 2001/0054376 A1 Dec. 27, 2001

(30) Foreign Application Priority Data

Jun. 20, 2000 (JP) ........................ 2000-184985
Dec. 12, 2000 (JP) ........................ 2000-377337

(51) Int. Cl.[7] .............................................. C30B 15/00
(52) U.S. Cl. ...................................................... 117/13
(58) Field of Search ............................. 117/14, 15, 201, 117/202, 217, 904

(56) References Cited

U.S. PATENT DOCUMENTS

| 5,665,159 A | * | 9/1997 | Fuerhoff ....................... 117/201 |
| 6,226,032 B1 | * | 5/2001 | Lees et al. ..................... 348/85 |
| 6,294,017 B1 | * | 9/2001 | Hurle et al. .................... 117/13 |
| 6,341,173 B2 | * | 1/2002 | Altekrüger et al. ......... 382/141 |

FOREIGN PATENT DOCUMENTS

| JP | 64-83595 | 3/1989 |
| JP | 5-194079 | 8/1993 |
| JP | 6-116083 | 4/1994 |

* cited by examiner

*Primary Examiner*—Felisa Hiteshew

(57) ABSTRACT

A single crystal pulling apparatus comprising, a laser unit 46 emitting a beam with a wavelength of 550 nm or less to form a spot on the surface of said melt, a spot camera 47 capturing the spot to produce electrical image signals corresponding thereto, an image processor 50 processing the electrical image signals to produce image data, and a control unit 49 receiving the image data and calculating a current melt level so that a crucible shaft lift 8 moves a crucible shaft up and down to adjust the melt level in accordance with the predetermined melt level.

12 Claims, 10 Drawing Sheets

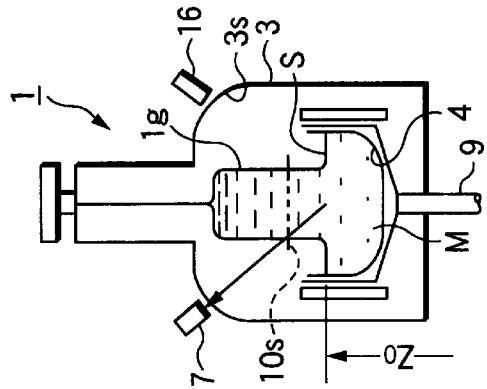
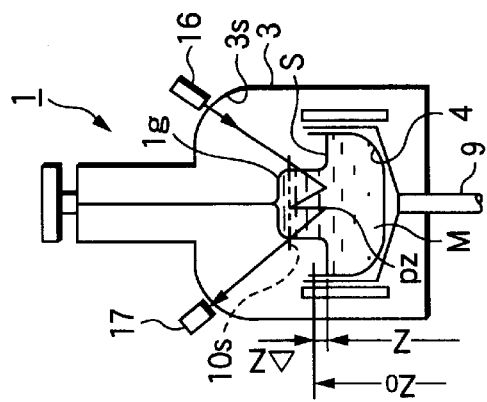
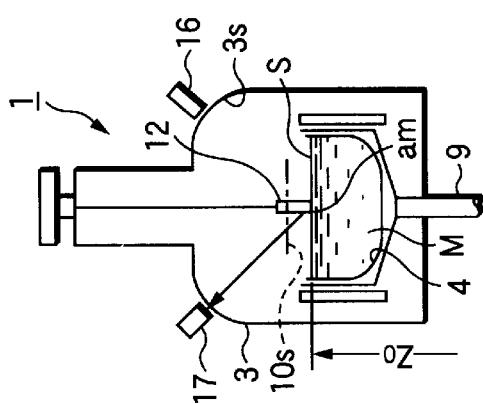
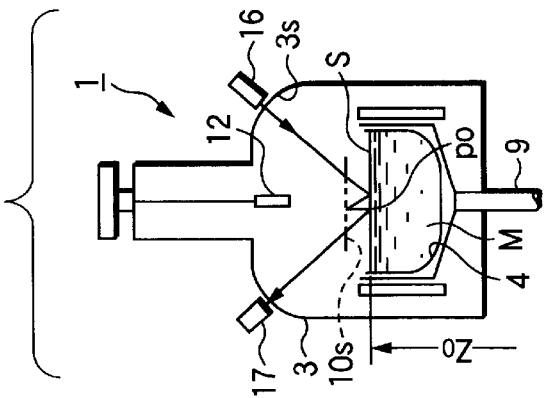
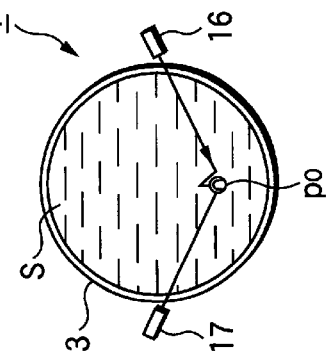

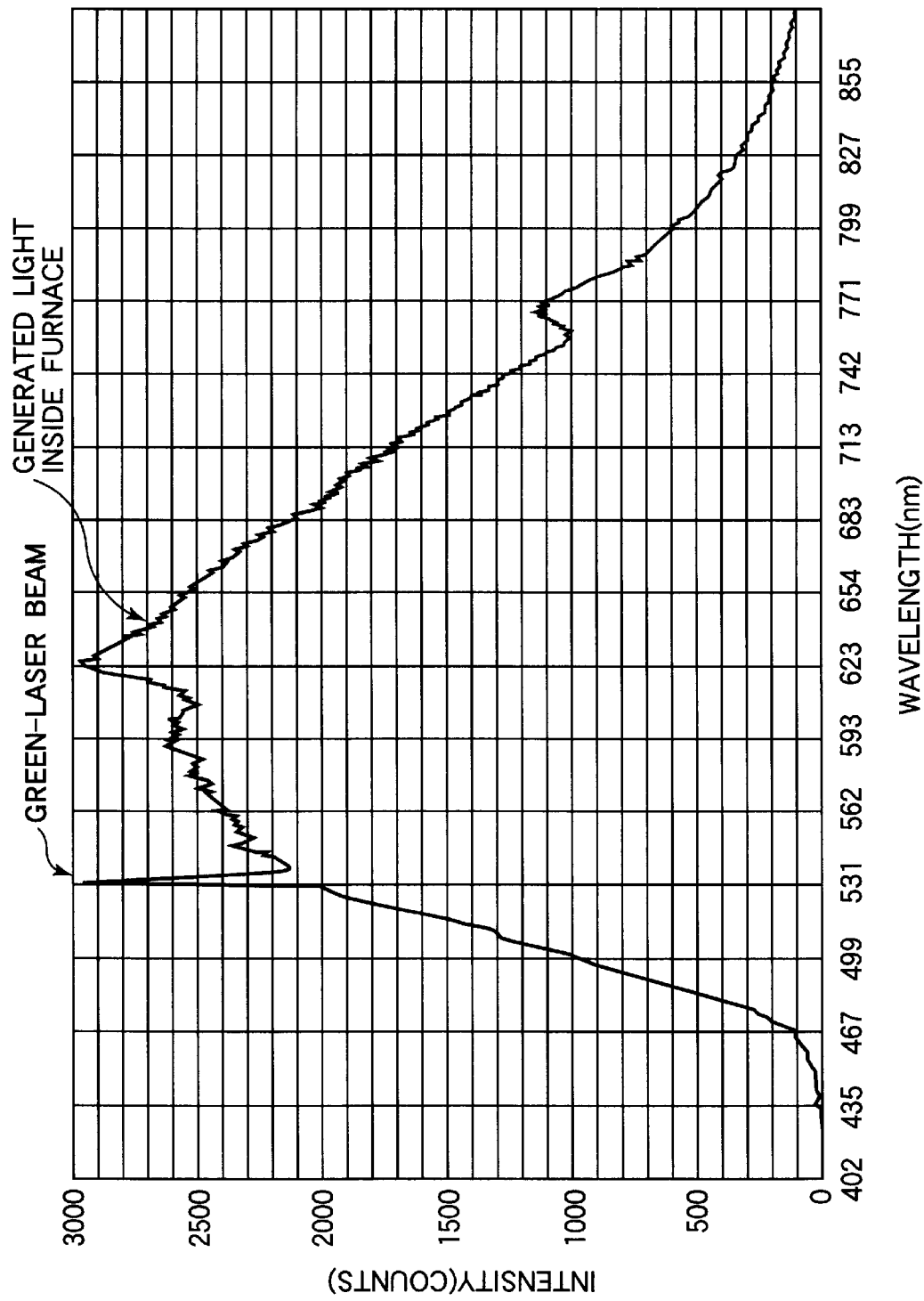

SINGLE CRYSTAL PULLING APPARATUS AND PULLING METHOD

BACKGROUND OF THE INVENTION

1. Field of the Invention

This invention relates to a pulling apparatus and a pulling method for single crystal production. More particularly, it relates to a pulling apparatus and a pulling method based on an automatic melt level control system in which a detection spot formed by a laser beam is imaged to produce image signals with which to control the melt level.

2. Description of the Related Art

A silicon single crystal called an ingot used to make silicon wafers is generally produced from polycrystalline silicon by Czochralski method (CZ method).

In the CZ method, the silicon melt level in a quartz glass-made crucible falls according as a silicon single crystal is pulled up. For obtaining high quality single crystals, it is important to control the position of the melt level constant in relation to a heater by driving the crucible shaft to lift the crucible. It is necessary to detect the melt level before the melt level can be controlled. Various methods have been proposed for melt level detection.

JP-A-6-116083 discloses a melt level control system in which a mechanical reference mark is provided on the inner material of a heating furnace, and a reflected image of the reference mark formed on the surface of a melt is sensed with a CCD camera.

In this system, a carbon heater disposed around the periphery of a quartz glass crucible is the light source for reflecting the reference mark on the melt surface. The brightness of the heater depends on the power consumed by the heater. However, the power is not constant because it is controlled based on the temperature of the silicon melt. Therefore, under some situations, for example, when the power reduces, the image formed on the melt surface becomes unclear and cannot be binalized, resulting in a failure to detect the melt level.

JP-A-64-83595 discloses a diameter measuring system which does not use a carbon heater as a light source, in which the distance between a detector and a melt surface is measured by means of a laser beam and an image sensor, and the crucible shaft is lifted to adjust that distance at a set value.

A melt level control system which does not rely on a carbon heater as a light source is also disclosed in JP-A-5-194079, in which the diameter of a spot formed by a laser beam is detected with a CCD camera, and a servo motor for a crucible shaft lift mechanism is operated so as to set the deviation of the detected diameter from a set diameter within a critical value.

Under strict safety standards, it is not easy to handle a high-output laser in these melt level control systems. It is desirable to limit the output of a laser unit used in the control system at 5 mW or less.

In order to study laser light that will form a spot directly on a silicon melt surface similarly to the conventional techniques, the inventors of the present invention examined light generated within a furnace. As a result, it was confirmed that the light emitted within a ceramic furnace while a crystal is being pulled up has a high intensity in a wavelength range of from about 500 to 700 nm as shown in FIG. 11. They tested at first a red laser having an oscillation wavelength of 640 to 770 nm which is relatively easy to handle and inexpensive but failed to form an adequate spot with an output of 5 mW. They also tried a green laser beam having a wavelength of 490 to 550 nm but found it incapable of forming a spot directly on the melt surface.

As a result of further investigations, the inventors have found that a spot can be formed on a melt surface by directing a laser beam whose wavelength is 550 nm or less, i.e., does not overlap with the wavelengths of the light emitted in the furnace, to a specific position of the melt surface.

That is, they have found that a spot can be formed on a melt surface even with a weak output by irradiating the melt surface with a laser beam having a wavelength of 550 nm or less such as a green laser beam.

In particular, they have found that a spot can be formed on the surface of a melt by emitting a laser beam having a wavelength of 550 nm or less from above a specific cylindrical cover (preferably made of an opaque ceramic material) placed above the melt. The cylindrical cover is composed of a cylindrical body portion (inclusive of an inverted conical body) having an upper and a lower opening for allowing a growing single crystal to pass through and a horizontal portion which extends from the lower end of the cylindrical body portion in the radial direction either inwardly or outwardly and faces the melt surface with a gap therebetween. The laser beam illuminates the melt surface below the horizontal portion of the cylindrical cover to form a spot on the melt surface near the illuminated position.

SUMMARY OF THE INVENTION

An object of the present invention is to provide a pulling apparatus and a pulling method in which a melt level can be detected accurately to enable automatic melt level control for obtaining a high-quality single crystal and which are safe and easy to handle or carry out.

The present invention provides, in its first aspect, a single crystal pulling apparatus comprising a quartz glass crucible provided in a chamber vessel and a heater for heating polycrystalline silicon put in the crucible to produce a melt, in which a seed crystal is dipped and lifted to pull a single crystal, the apparatus having a laser unit which emits a beam having a wavelength of 550 nm or less to form a spot on the surface of the melt, an image capturing unit for capturing the spot to produce image signals, a control unit which receives the image signals as binalized and processed by an image processing means, and a crucible shaft lift which lifts a crucible shaft under instructions from the control unit to adjust the melt level.

The present invention provides, in its second aspect, a single crystal pulling apparatus comprising a quartz glass crucible provided in a chamber vessel and a heater for heating polycrystalline silicon put in the crucible to produce a melt, in which a seed crystal is dipped and lifted to pull a single crystal, the apparatus having a cylindrical cover placed above the crucible to surround a growing single crystal, a laser unit which emits a beam having a wavelength of 550 nm or less to form a spot on the surface of the melt, an image capturing unit for forming an image of the spot to produce image signals, a control unit which receives the image signals as binalized and processed by an image processing means, and a crucible shaft lift which lifts a crucible shaft under instructions from the control unit to adjust the melt level, the cylindrical cover being composed of a cylindrical body portion having an upper and a lower opening for allowing a growing single crystal to pass through and a horizontal portion which extends from the lower end of the cylindrical body portion in the radial direction either inwardly or outwardly and faces the melt with a gap therebetween.

In a preferred embodiment of the first and the second aspects of the present invention, the laser beam illuminates a light transmitting object provided between the laser unit and the melt level to form a virtual image of a spot on the melt surface.

In a still preferred embodiment, the light transmitting object is provided in the horizontal portion of the cylindrical cover.

In another preferred embodiment, the laser beam is a green laser beam or a blue laser beam.

In yet another preferred embodiment, the automatic melt level control system comprising the image capturing unit, the image processing means, and the control unit also serves for automatic diameter control.

The present invention also provides, in its third aspect, a single crystal pulling method comprising charging a semiconductor raw material into a quartz glass crucible that can be lifted in a chamber vessel, heating the raw material into a melt, dipping a seed crystal in the melt, and lifting the seed crystal to pull a single crystal, wherein a spot for melt level detection is formed on the melt surface by a laser beam having a wavelength of 550 nm or less, the spot is imaged to produce image signals, which are binalized and processed into melt level data, and the crucible is lifted based on the melt level data to control the melt level.

In a preferred embodiment of the third aspect, the laser beam is directed to a light transmitting object provided in the path of the laser beam to form a virtual image of a spot on the melt surface.

The present invention also provides, in its fourth aspect, a single crystal pulling method comprising charging polycrystalline silicon into a quartz glass crucible that can be lifted in a chamber vessel, heating the polycrystalline silicon into a melt, pulling down a seed crystal through a hole of a cylindrical cover disposed above the crucible, dipping the seed crystal in the melt, and lifting the seed crystal to pull a single crystal, wherein a laser beam having a wavelength of 550 nm or less is projected to the melt surface and reflected on the melt surface to form a spot on the back side of a horizontal portion extending from the lower end of the cylindrical cover, the spot is imaged to produce image signals, which are binalized and processed into melt level data, and the crucible is lifted based on the melt level data to control the melt level.

BRIEF DESCRIPTION OF THE DRAWINGS

FIGS. 2(A) through 2(D) illustrate spot capturing with a CCD camera in different stages of the pulling method using the apparatus shown in FIG. 1.

FIG. 11 is a spectrum of green laser light used for melt level detection and the light generated in the chamber vessel of a single crystal pulling apparatus.

DESCRIPTION OF THE PREFERRED EMBODIMENTS

A first embodiment of the single crystal pulling apparatus according to the present invention is described with reference to the accompanying drawings.

Figure 1:
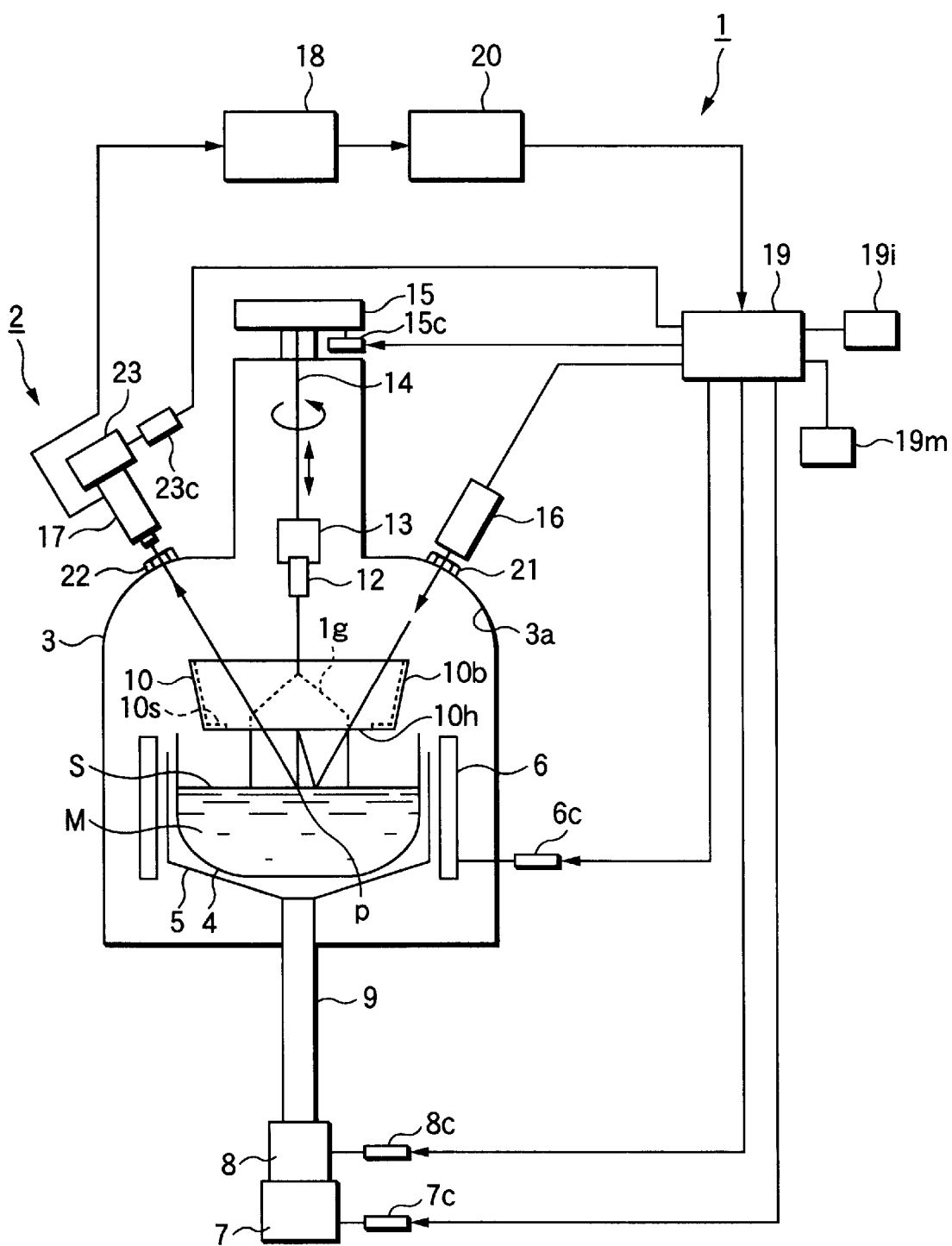
FIG. 1 shows a first embodiment of the single crystal pulling apparatus according to the invention.

A single crystal pulling apparatus 1 according to the first embodiment is shown in FIG. 1. The apparatus 1 comprises a melt level control system 2, a water-cooled furnace 3, a quartz glass crucible 4 which is placed in the furnace 3 and into which a raw material (polycrystalline silicon) is charged and melted into a silicon melt M, a graphite crucible 5 holding the quartz glass crucible 4, and a heater 6 surrounding the graphite crucible 5. The graphite crucible 5 is fixed to a crucible shaft 9 piercing the furnace 3. The crucible shaft 9 is rotated by a motor 7 and lifted by a crucible shaft lift 8 under control by the melt level control system 2.

A cylindrical cover 10 is provided above the quartz glass crucible 4 in order to protect a growing single crystal against radiant heat from the quartz glass crucible 4 and from the surface of the silicon melt M thereby to prevent reduction of the ingot (Ig) lift rate. The cylindrical cover 10 is composed of a cylindrical body portion, e.g., an inverted conical body portion 10b, having an opening 10h through which an ingot Ig passes and a horizontal portion 10s extending from the lower end of the conical body portion 10b in the radial direction either inwardly (as in this specific drawing) or outwardly. A pull wire 14 having a seed chuck 13 holding a seed crystal 12 is provided above the quartz glass crucible 4. The pull wire 14 is connected to a wire rotation unit 15 which is provided outside the furnace 3 and driven by a motor (not shown) to wind the wire 14 while rotating the wire 14.

The melt level control system 2, which is disposed outside the furnace 3, comprises a laser unit 16 emitting coherent light for detection, an image capturing unit 17, which is typically a CCD camera 17, a binalization circuit 18 connected to the CCD camera 17, a control unit 19 having a monitor 19m and an input terminal 19i, an image processor 20 connected to the control unit 19, and a crucible shaft lift 8 which is controlled by a lift controller 8c. The laser unit 16 which is set at a vertical angle β and the CCD camera 17 which is set at a vertical angle α (see FIG. 5(A)) are disposed in such an optical configuration that a laser beam having been emitted from the laser unit 16, passed through a light transmitting port 21 made on the shoulder 3a of the furnace 3 and reflected on the melt surface S may pass through another light transmitting port 22 made on the furnace shoulder 3a and reach the CCD camera 17. The optical configuration of the laser unit 16 and the CCD camera 17 is also such that the optical system may not interfered with the cylindrical cover 10. Specifically, the optical axes of the incident light and the reflected light pass through a gap between the opening 10h and the body of the single crystal Ig being pulled up in the opening 10h, forming a laser spot near the periphery of the surface of the silicon melt M.

In the apparatus 1, the binalization circuit 18 and the image processor 20 compose an image processing means, and the crucible shaft lift 8 and the lift controller 8c compose a crucible shaft lifting means.

If necessary, light transmitting holes can be made through the cylindrical cover 10 for allowing the respective optical axes to pass through.

The laser unit 16 emits a beam having a wavelength of 550 nm or less, for example, a green laser beam having a wavelength of 490 to 550 nm, to avoid the wavelength of the light generated in the furnace 3 by the heater 6. The output of the laser unit 16 is 5 mW or lower, e.g., 3 mW.

The reason of using a laser beam having a wavelength of 550 nm or less is as follows.

In a general pulling method, light produced in the furnace by a heater in each stage of pulling has an intensity peak around 623 nm as shown in the spectrum of FIG. 11. Therefore, the intensity peak of green laser light from a laser having an output of about 5 mW does not overlap with that of the light generated in the furnace. That is, a spot formed on the melt surface by a green laser beam, even with a small output, can securely be sensed by a CCD camera without interference by the light generated in the furnace. Not being influenced by the light generated in the furnace, blue laser light having a wavelength of 430 to 490 nm is usable as well.

The CCD camera 17 can serve for two functions. One of the functions is to control the melt level, and the other is to control the diameter of the growing single crystal. In performing the former function, the CCD camera 17 images a spot p formed by a laser beam emitted from the laser unit 16, and the image is binalized in the binalization circuit 18, processed in the image processor 20, and inputted to the control unit 19. The control unit 19 corrects the lift rate of the crucible shaft lift 8 via the lift controller 8c based on the input thereby to adjust the lift rate of the quartz glass crucible 4.

In performing the latter function, the CCD camera 17 images the neck, the body, and the tail which are irradiated with the light generated from the heater 6 are therefore relatively easy to capture, and the image data is inputted to the control unit 19. Based on the input, the control unit 19 controls a heater controller 6c, a motor controller 7c, and a wire reel rotation unit controller 15c to adjust the pulling condition thereby controlling the crystal diameter.

In order for the CCD camera 17 to perform the above-described two functions, the CCD camera 17 is fitted to an capturing position adjustment mechanism 23, which is connected to the control unit 19 via a position adjustment mechanism controller 23c. The capturing position adjustment mechanism 23 adjusts the vertical angle and the horizontal angle of the CCD camera based on the output data from the control unit 19 so that the CCD camera can capture an image of an arbitrary position of the melt surface S within a certain range of the melt level.

Instead of using a single CCD camera for carrying out the abovementioned two functions, two CCD cameras may be provided, one for capturing the spot p and the other for capturing the neck, the body or the tail.

While in the above-described embodiment the cylindrical body portion of the cylindrical cover has the shape of an inverted cone, the shape of the cylindrical body portion is not limited thereto and includes, for example, an upright cylinder.

The pulling method using the apparatus 1 for production of a silicon single crystal will now be described.

As shown in FIG. 1, polycrystalline silicon as a raw material is charged into the quartz glass crucible 4, and a seed crystal 12 is attached to the seed chuck 13. The furnace 3 is closed, and the heater controller 6c is operated by the control unit 19 to operate the heater 6. The polycrystalline silicon is thus melted into a silicon melt M.

Figure 3:
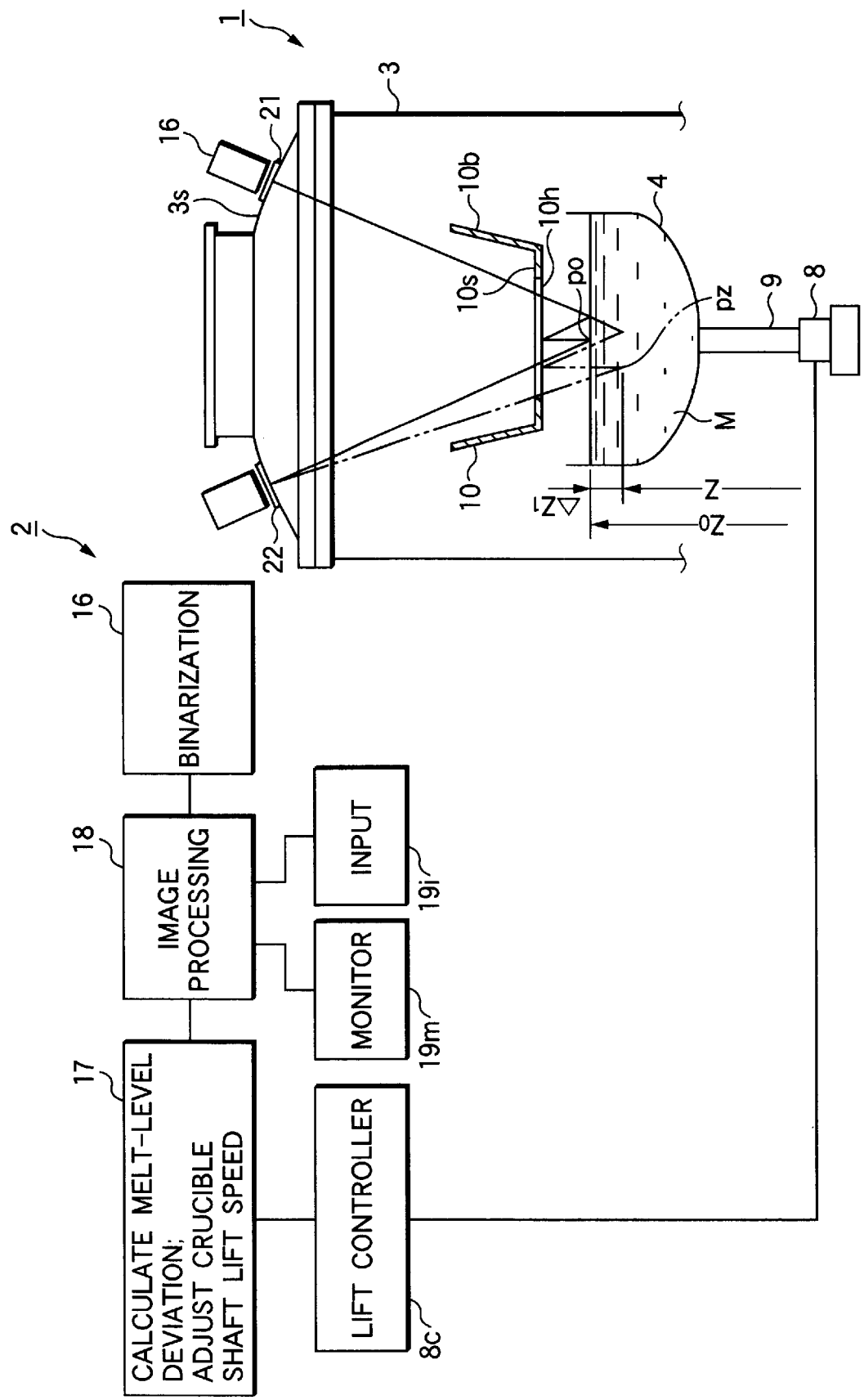
FIG. 3 depicts the automatic melt level control system in the first embodiment.
Figure 4:
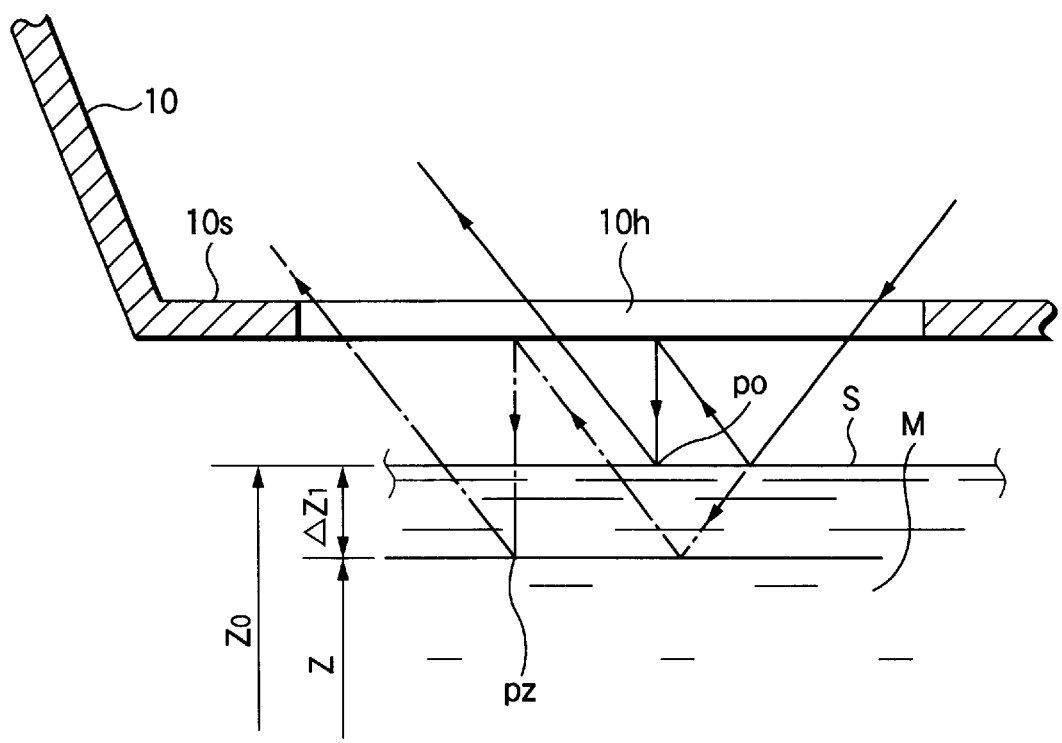
FIG. 4 is an enlarged view of the spot forming part of the apparatus shown in FIG. 1.

The level of the melt surface S is set at a prescribed preferred position in relation to the heater 6 by means of a melt level detector (not shown) provided on the cylindrical cover 10. The absolute height of the melt surface S in this situation is referred to as a reference height $Z_0$ as indicated in FIGS. 2 through 4.

The subsequent step of pulling is carried out automatically according to a pulling program put in the memory of the control unit 19.

The laser unit 16 previously positioned to irradiate the melt surface S emits a green laser beam (wavelength: 490 to 550 nm) as instructed by the control unit 19. Enlarged views of the spot forming part in FIGS. 2 and 3 are shown in FIGS. 4 and 5. The green laser beam is reflected on the melt surface S to form a spot on the back side of the horizontal portion 10s of the cylindrical cover 10, which spot is further reflected to form a spot $p_0$ on the melt surface S.

Figure 5A:
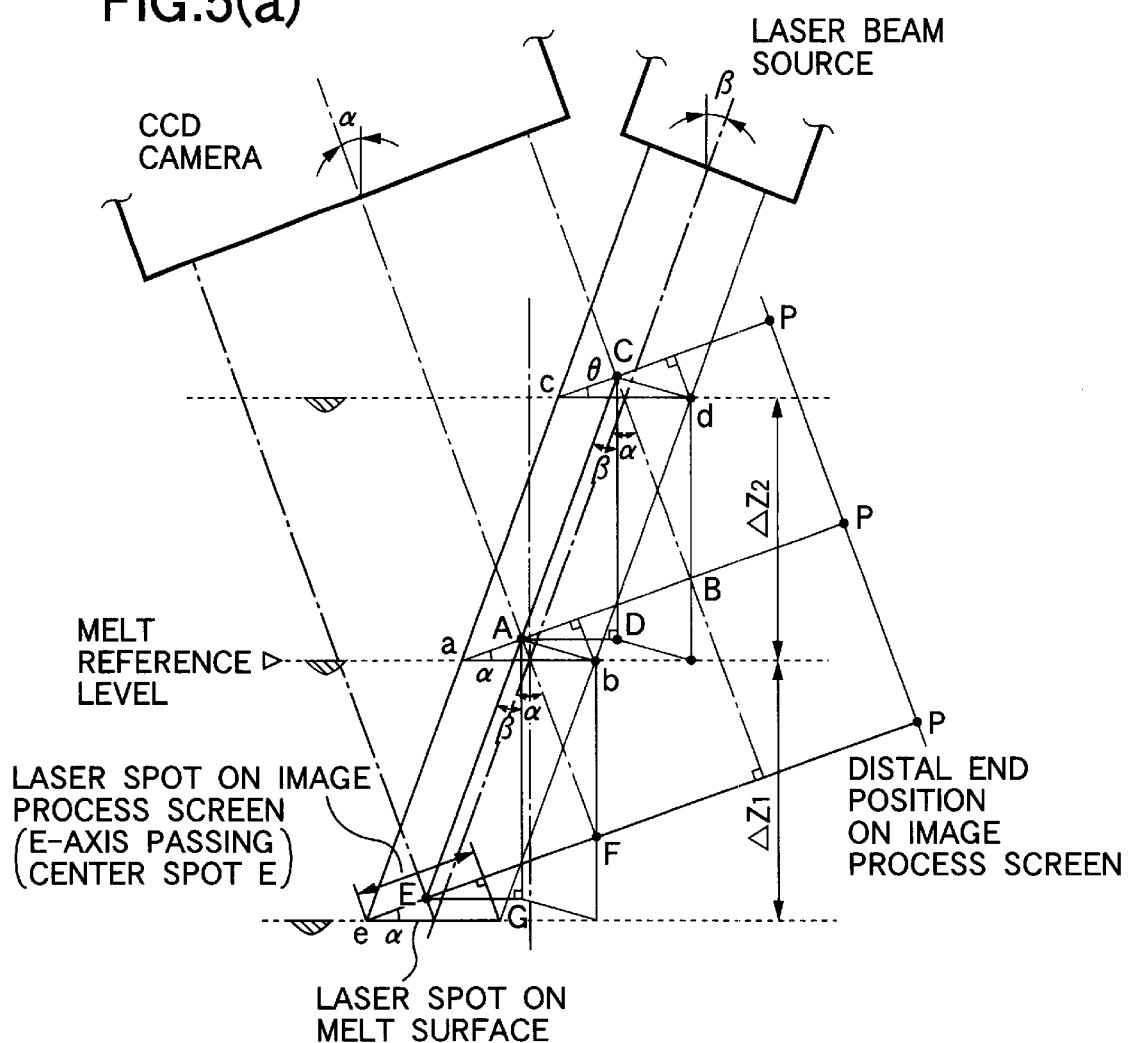
FIGS. 5(A) and 5(B) show the principle for obtaining a deviation from a reference melt level based on the image data from the CCD camera in the first embodiment.

As shown in FIG. 5(A), the CCD camera 17 is set at a vertical angle α to be focused on the spot $p_0$ (particularly on the center of coordinates of the spot $p_0$) on the melt surface s. The spot $p_0$ is imaged and converted into image signals by the CCD camera 17 as shown in FIGS. 1 and 2A. The image signals are binalized, processed, and inputted into the memory of the control unit 19 as reference height $Z_0$ data of the melt surface S. The wire rotation unit 15 is operated via the rotation unit controller 15c. In FIG. 2, the cylindrical cover 10 is represented by the back side of the horizontal portion 10s with the conical portion omitted.

As shown in FIG. 1, the wire reel rotation unit controller 15c operates the wire rotation unit 15 as instructed by the control unit 19 to release the wire 14 down and to dip the seed 12 in the silicon melt M. After the seed 12 is stabilized, the wire 14 is wound to pull the seed 12 while forming the neck of a single crystal Ig. At this stage of neck formation, the control unit 19 operates the capturing position adjustment mechanism 23 to move the CCD camera 17 for capturing the neck growth section $a_n$ as shown in FIG. 2B. The image signals of the neck growth section $a_n$ are processed in the same manner as described above and inputted to the control unit 19. The control unit 19 compares the input with the neck diameter data previously stored in memory to check whether pulling is being effected normally.

As the seed is lifted, a shoulder section of a single crystal ingot Ig is formed. Similarly to the neck capturing, the CCD camera 17 is moved to capture the shoulder growth section, and the image signals of the shoulder growth section are processed and sent to the control unit 19. The control unit 19 compares the input with the shoulder diameter data previously stored in memory to check whether pulling is being effected normally.

Since the melt level begins to lower as the shoulder is pulled up, the melt level (the height Z of the melt surface S) is detected, for example, as follows.

As shown in FIGS. 2C, 3, and 4, the laser unit 16 emits a green laser beam under instructions from the control unit 19 to form a spot $p_z$ on the melt surface S. On the other hand, the CCD camera 17 that has been returned to the same state as for capturing the spot $p_0$ (reference height $Z_0$) images the spot $p_z$ to produce image signals, which are binalized, processed, and put into the memory of the control unit 19 as image information corresponding to the height Z.

As shown in FIG. 5(A), the control unit 19 compares the reference height $Z_0$ data and the height Z data in the memory to obtain a deviation from the reference height $Z_0$, i.e., $\Delta Z_1$ (AG).

Although AG (CD) is not strictly equal to $\Delta Z_1$ because a laser beam is divergent at a small angle so that the diameter of the beam spot increases as the melt level lowers (dc<ba<fe), it would be safe to regard the increase as being negligible, i.e., to regard $\Delta Z_1$ as equaling $\overline{AG}$. That is, $\overline{AG}$=cos $\beta \times \overline{AE}$, $\overline{AE}=\overline{FE}/\sin(\alpha+\beta)$, and $\overline{FE}=\overline{PE}-\overline{PA}$. Accordingly, a count of the pixels of $\overline{AE}$ on the image gives $\Delta Z_1$, from which is obtained the absolute height Z of the melt surface S. The input from the control unit 19 corrects the lift rate of the crucible shaft lift 8 via the lift controller 8c to raise the quartz glass crucible 4 by $\Delta Z_1$, whereby the drop $\Delta Z_1$ of the level is restored to the reference height $Z_0$ suitable for pulling.

Figure 5B:
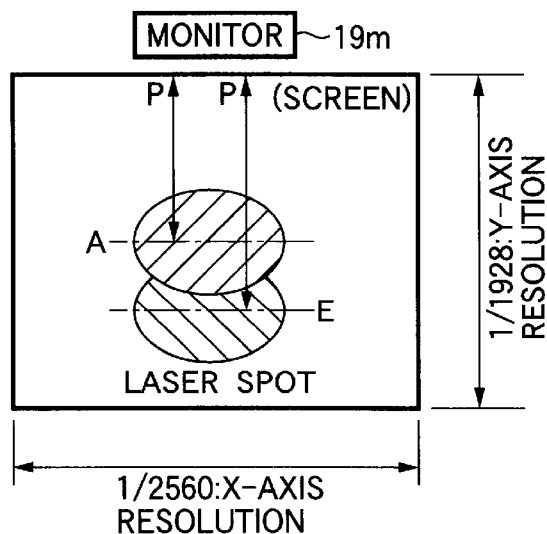

In the monitor 19m of FIG. 5(B) are displayed the images of the spots $p_0$ and $p_z$.

The pulling is continued further to form the body of the single crystal Ig as shown in FIG. 2D. In the same manner as described above, the CCD camera 17 is then moved to form an image of the body growth section $a_s$, and the image signals of the body growth section $a_s$ are processed and inputted into the control unit 19. The control unit 19 compares the input with the body diameter data previously stored in memory to check whether pulling is being effected normally. Detection of the melt surface S and capturing of the body growth section $a_s$ are carried out repeatedly to constantly make corrections of the height Z to the reference height $Z_0$ and corrections of the pulling conditions so that the single crystal Ig may be pulled with a constant diameter. Finally, the tail of the single crystal Ig is formed to complete single crystal production.

The crystal pull rate is several millimeters per minute. In other words, the crystal growth rate and the melt level drop rate are so low that a single CCD camera 17 suffices for alternately furnishing image signals for diameter control and image signals for melt level control to control the temperature of the heater 6, the wire winding rate of the wire rotation unit 15, the crucible rotation rate of the crucible rotation motor 7, the lift rate of the crucible shaft lift 8, and the like. Even with the single CCD camera 17, it will not happen that the timing for diameter correction and melt level correction is lost to reduce the single crystal quality.

The wavelength of the green laser light (490 to 550 nm) from the laser unit 16 does not overlap with that of the light produced from the heater 6 in the furnace 3 irrespective of the brightness (i.e., output) of the heater 6 in every stage of the single crystal production. The spot p formed by the green laser beam on the melt surface S can be securely imaged with the CCD camera 17 at an output of 5 mW or even smaller without interference by the light generated in the furnace. Even where the laser unit 16 has a low output, capturing accuracy can be secured by focusing the CCD camera 17 on the center of the coordinates of the spot p. As a result, the melt level is detected with accuracy, making it possible to always conduct pulling while maintaining an optimum melt level to produce a high-quality ingot.

The laser unit 16, having an output as low as 5 mW or less, is small in size, safe, and easy to handle.

A second embodiment of the single crystal pulling apparatus according to the present invention is then described.

The difference of the second embodiment from the first one resides in that laser light (550 nm or less) is directed to a light transmitting object which pierces the horizontal portion of the cylindrical cover in the thickness direction, and a spot is formed on the melt surface right under the light transmitting object by irregular reflection of the light.

Figure 6:
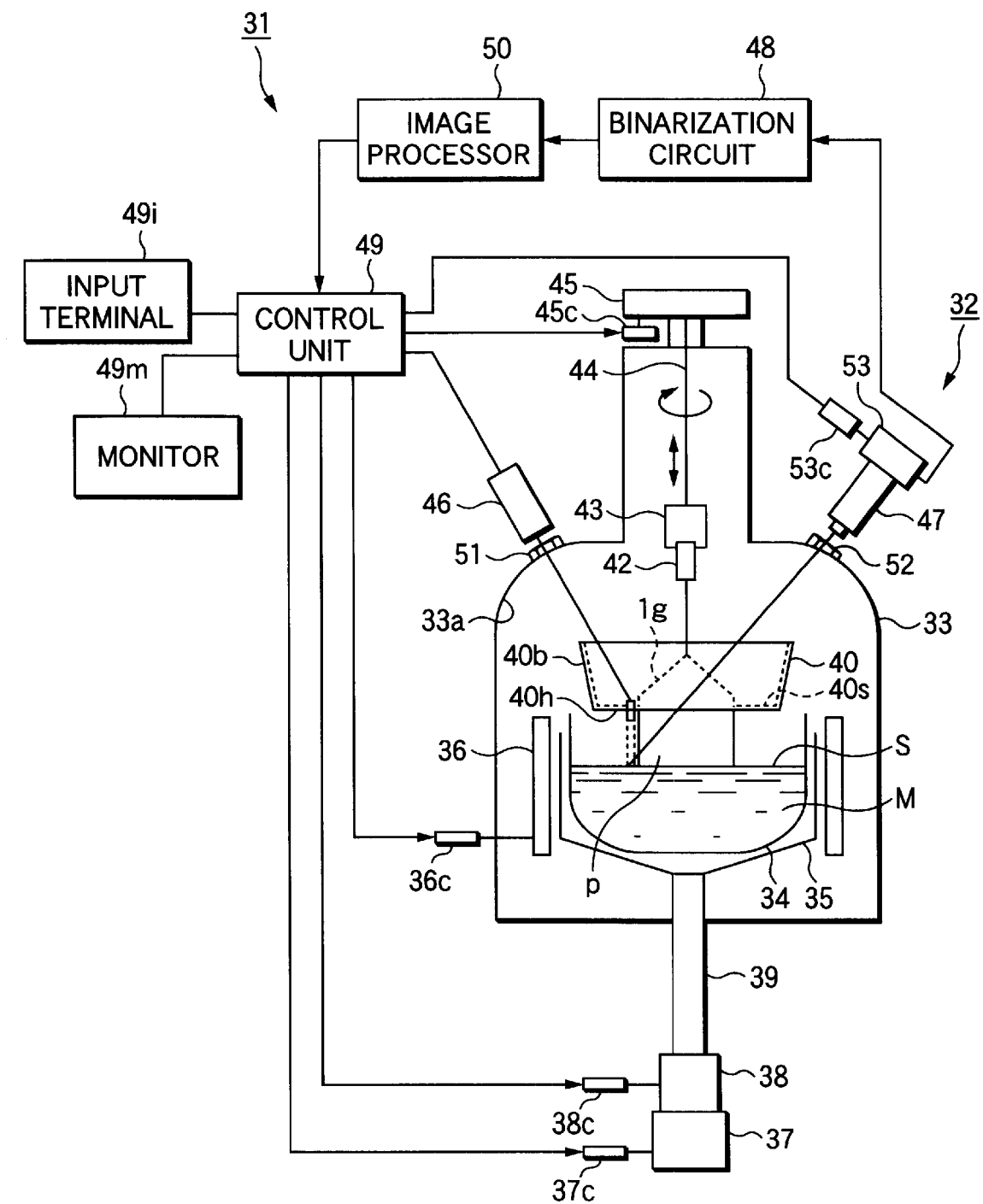
FIG. 6 shows a second embodiment of the single crystal pulling apparatus according to the invention.

A single crystal pulling apparatus 31 according to the second embodiment is shown in FIG. 6. The apparatus 31 comprises a melt level control system 32, a water-cooled chamber vessel 33, a quartz glass crucible 34 which is placed in the chamber vessel 33 and into which a raw material (polycrystalline silicon) is charged and melted to produce a silicon melt M, a graphite crucible 35 holding the quartz glass crucible 34, and a heater 36 provided around the periphery of the graphite crucible 35. The graphite crucible 35 is fixed to a crucible shaft 39 piercing the chamber vessel 33. The crucible shaft 39 is rotated by a motor 37 and lifted by a crucible shaft lift 38 under control by the melt level control system 32.

A cylindrical cover 40 is provided above the quartz glass crucible 34 in order to protect a growing single crystal against radiant heat from the quartz glass crucible 34 and from the surface of the silicon melt M thereby to prevent reduction of the ingot (Ig) lift rate. The cylindrical cover 40 is composed of a cylindrical body portion, e.g., an inverted conical body portion 40b, having an opening 40h through which an ingot Ig passes and a horizontal portion 40s extending from the lower end of the conical body portion 40b in the radial direction either inwardly (as in this specific drawing) or outwardly. A pull wire 44 having a seed chuck 43 holding a seed crystal 42 is provided above the quartz glass crucible 34. The pull wire 44 is connected to a wire rotation unit 45 which is provided outside the chamber vessel 33 and driven by a motor (not shown) to wind the wire 44 while rotating the wire 44.

Figure 10A:
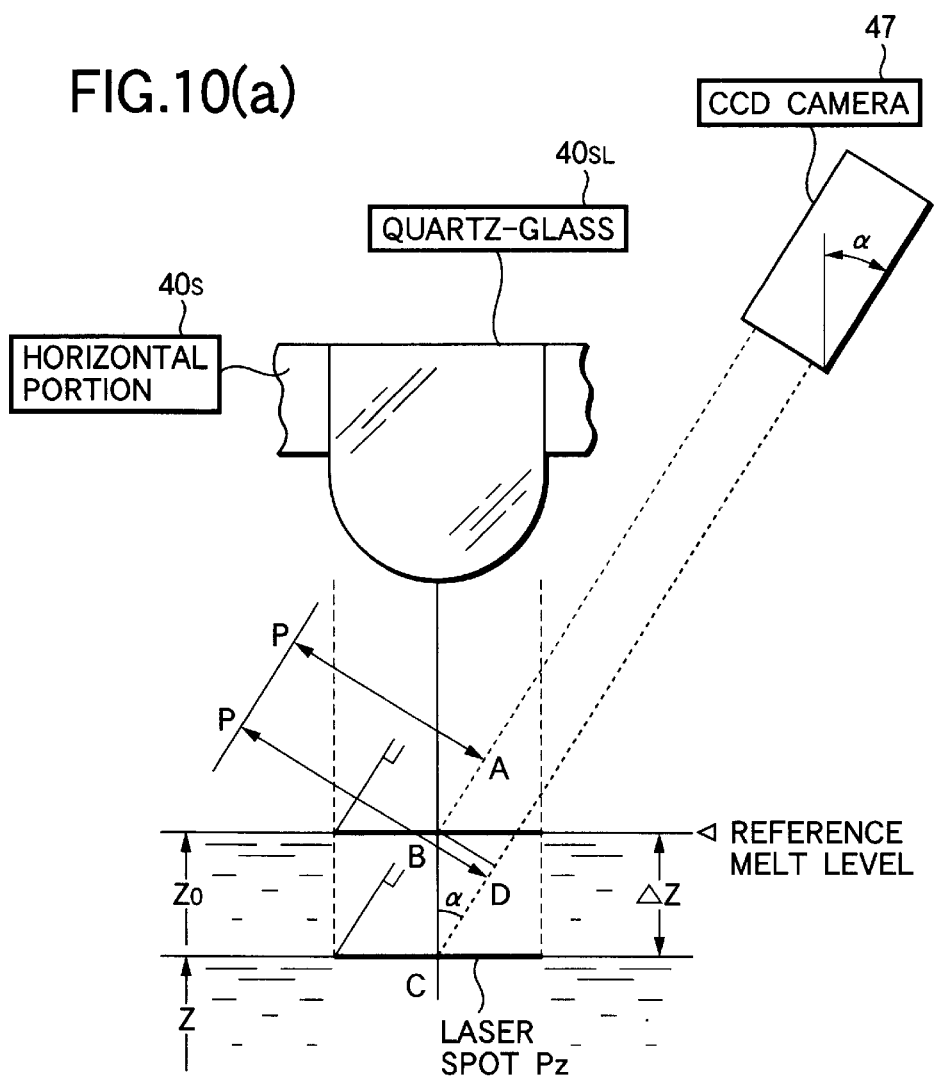
FIGS. 10(A) and 10(B) present the principle for obtaining a deviation from a reference melt level based on the image data from the CCD camera in the second embodiment.

The melt level control system 32, which is disposed outside the chamber vessel 33, comprises a laser unit 46 emitting coherent light for detection, an image capturing unit 47, which is typically a CCD camera 47, a binalization circuit 48 connected to the CCD camera 47, a control unit 49 having a monitor 49m and an input terminal 49i, an image processor 50 connected to the control unit 49, and a crucible shaft lift 38 which is controlled by a lift controller 38c. The laser unit 46 which is set at a certain vertical angle and the CCD camera 47 which is set at a vertical angle $\alpha$ as shown in FIG. 10(A) are disposed in such an optical configuration that a laser beam having been emitted from the laser unit 46, passed through a light transmitting port 51 made on the shoulder 33a of the chamber vessel 3 and reflected on the melt surface S may pass through another light transmitting port 52 made on the chamber shoulder 33a and reach the CCD camera 47.

In the apparatus 31, the binalization circuit 48 and the image processor 50 compose an image processing means, and the crucible shaft lift 38 and the lift controller 38c compose a crucible shaft lifting means.

Figure 7:
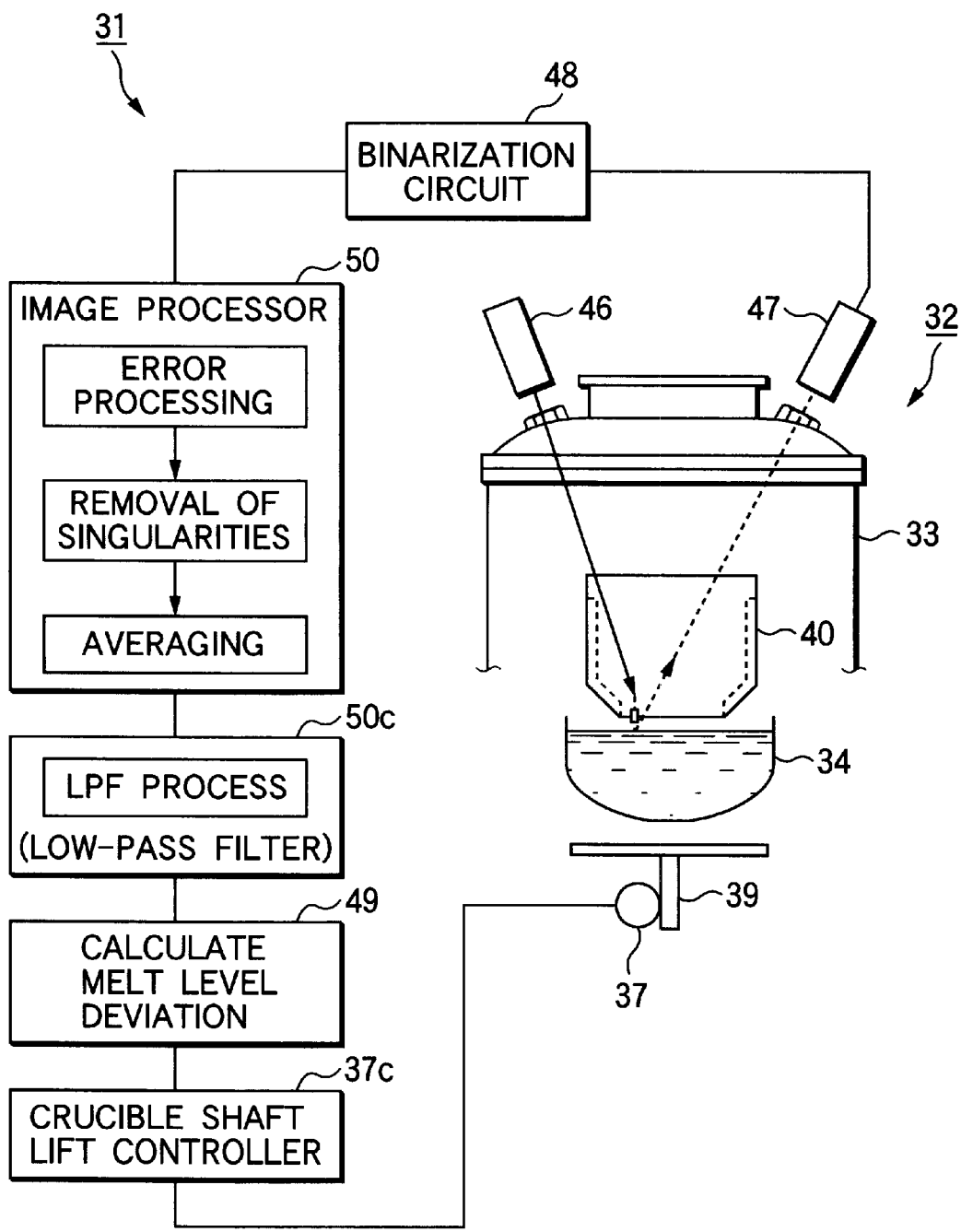
FIG. 7 illustrates the automatic melt level control system in the second embodiment.

As shown in the block diagram of FIG. 7, the image data from the CCD camera 47, as binalized in the binalization circuit 48, are processed in the image processor 50 which effects error processing, removal of singularities and averaging. After low-pass filter (LPF) processing in an LPF circuit 50c, the processed image data are inputted into the control unit 49. The control unit 49 computes the melt level deviation to control the crucible shaft lift 38 through the lift controller 38c.

Figure 8:
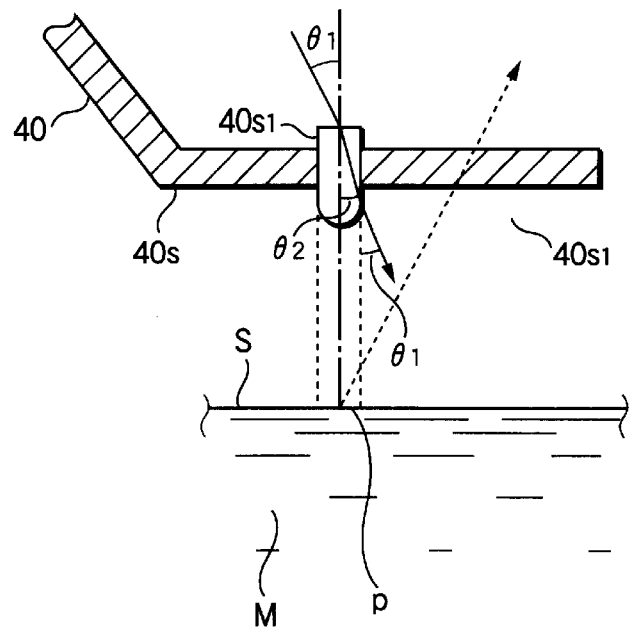
FIG. 8 is an enlarged view of the spot forming part of the apparatus shown in FIG. 6.

The horizontal portion 40s of the cylindrical cover 40 has a light transmitting object which is in the optical path from the laser unit 46 to the CCD camera 47 for allowing the laser light to pass through the horizontal portion 40s. For example, a light transmitting object $40s_1$ shown in FIG. 8 is a quartz glass column having a diameter of 2 to 4 mm and a height of 20 to 30 mm with its lower end rounded into a hemisphere. The refractive index of light in vacuo is 1 while that of quartz glass making the light transmitting object $40s_1$ is from 1.4 to 1.5. A laser beam incident on the light transmitting object $40s_1$ at an incidence angle of θ1 is refracted by the light transmitting object $40s_1$ at a refraction angle of θ2. While the laser beam is transmitted through the light transmitting object $40s_1$ and emitted at the angle θ1, the light transmitting object $40s_1$ which transmits the laser light gains in brightness to project a spot p as a virtual image on the melt surface S, which can be detected by the CCD camera 47 through the gap between the single crystal Ig and the horizontal portion 40s.

The laser unit 46 emits a beam having a wavelength which does not overlap with the light generated from the heater 36 in the chamber vessel, for example, a green laser beam having a wavelength of 550 nm or less (490 to 550 nm). The output of the laser unit 46 is, e.g., 3 mW.

The CCD camera 47 can serve for two functions similarly to the CCD camera 17 used in the first embodiment. One of the functions is to control the melt level, and the other is to control the diameter of the growing single crystal. In performing the former function, the CCD camera 47 images a spot p formed by a laser beam emitted from the laser unit 46, and the image is binalized in the binalization circuit 48, processed in the image processor 50, and inputted to the control unit 49. The control unit 49 corrects the lift rate of the crucible shaft lift 38 via the lift controller 38c based on the input thereby to adjust the lift rate of the quartz glass crucible 34.

In performing the latter function, the CCD camera 47 images the neck, the body, and the tail which, being irradiated with the light generated from the heater 36, are relatively easy to capture by a CCD camera, and the image data is inputted to the control unit 49. The input controls a heater controller 36c, a motor controller 37c, and a wire reel rotation unit controller 45c to adjust the pulling condition thereby controlling the crystal diameter.

In order for the CCD camera 47 to perform the above-described two functions, the CCD camera 47 is fitted in such a manner as to change the vertical angle of its optical axis so as to capture an image of an arbitrary position of the melt surface S within a certain range of the melt level based on the output from the control unit 49. Two CCD cameras may be provided, one for capturing the spot p and the other for capturing the growing sections of the single crystal.

Figure 9:
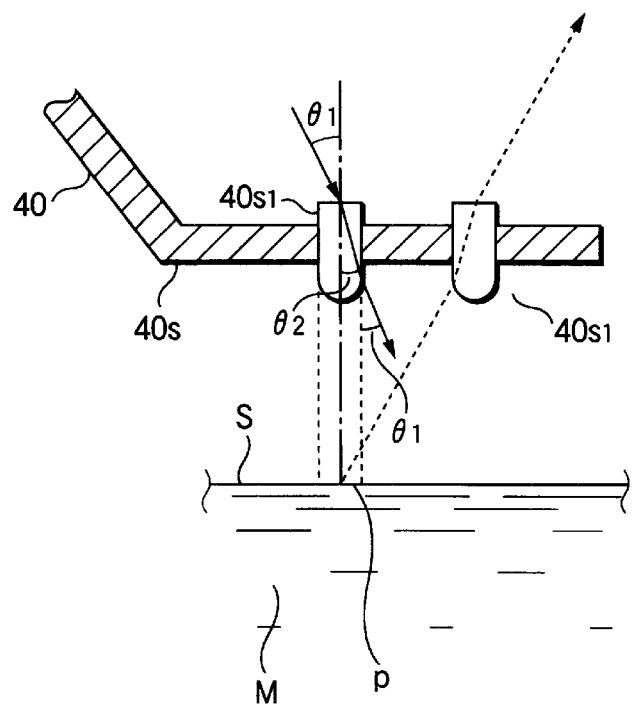
FIG. 9 shows a modification to the spot forming part shown in FIG. 8.

Two light transmitting objects $40s_1$ may be provided in the horizontal portion 40s in the optical path as shown in FIG. 9. In this case, the cylindrical cover 40 can be designed to have a smaller gap between the single crystal and the inner edge of the horizontal portion 40s.

The pulling method using the apparatus 31 for production of a silicon single crystal will now be described.

As shown in FIG. 6, polycrystalline silicon in the quartz glass crucible 34 is melted by the heater 36 to make a silicon melt M.

The level of the melt surface S is set at a right position in relation to the heater 36 by means of a melt level detector (not shown) provided on the cylindrical cover 40. The absolute height of the melt surface S in this situation is referred to as a reference height $Z_0$ as indicated in FIG. 10(A).

The subsequent step of pulling is carried out automatically according to a pulling program put in the memory of the control unit 49.

The laser unit 46 previously positioned to illuminate the top of the light transmitting object $40s_1$ emits a green laser beam (wavelength: 490 to 550 nm) as instructed by the control unit 49. An enlarged view of the spot forming part in FIGS. 6 and 7 is shown in FIG. 8. The laser light incident on the top of the light transmitting object $40s_1$ at an incidence angle θ1 is refracted at a refraction angle θ2 due to the difference in refractive index between air and quartz glass, transmitted through the object $40s_1$, and emitted at a vertical angle of θ1. As a result, the light transmitting object $40s_1$ increases its brightness to form a virtual image (spot) $p_0$ on the melt surface S right under it by irregular reflection of the light.

As shown in FIGS. 7 and 10, the CCD camera 47 is focused on the spot $p_0$ (particularly on the center of coordinates of the spot $p_0$) on the melt surface S. The image of the spot $p_0$ is sensed and converted into image signals by the CCD camera 47, which are binalized, processed, and put into the memory of the control unit 49 as reference height $Z_0$ data. The wire rotation unit 45 is then operated via the rotation unit controller 45c.

As the wire 44 is wound up, a single crystal is pulled, forming a neck, a shoulder, and a body successively. Since the melt level begins to lower with pulling, the melt level (the height Z of the melt surface S) is detected as follows. In the example shown below, the height Z of the melt surface S is detected while the body section is growing.

As shown in FIGS. 6 and 10, the laser unit 46 emits a green laser beam under instructions from the control unit 49 to form a spot $p_z$ on the melt surface S. The CCD camera 47 images the spot $p_z$ to produce electrical image signals, which are binalized in the binalization circuit 48, processed in the image processor 50, and put into the memory of the control unit 49 as image information corresponding to the height Z.

As shown in FIG. 10(A), the control unit 49 compares the reference height $Z_0$ data and the height Z data in the memory to compute a deviation from the reference height $Z_0$, ΔZ ($Z_0-Z=\overline{BC}$).

$\overline{AD}=\overline{PD}-\overline{PA}$. $\overline{AD}=\overline{BC}\sin\alpha$. $\overline{BC}=\overline{AD}/\sin\alpha$. Accordingly, a count of the pixels of AD on the image gives ΔZ ($\overline{BC}$), from which obtained is the absolute height Z of the melt surface S. The input from the control unit 49 corrects the lift rate of the crucible shaft lift 38 via the lift controller 38c to raise the quartz glass crucible 34 by ΔZ, whereby the drop ΔZ of the level is restored to the reference height $Z_0$ suitable for pulling.

Figure 10B:
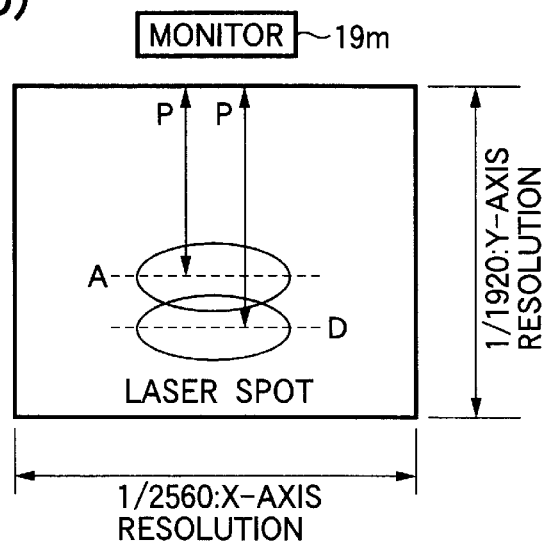

In the monitor 49m shown in FIG. 10(B) are displayed the images of the spots $p_0$ and $p_z$.

While the single crystal Ig is being pulled, the CCD camera 47 is occasionally turned to capture the image of the body growth section of the single crystal Ig to give image signals, which are binalized, processed and inputted into the control unit 49 in the same manner as described above. The control unit 49 compares the input with the body diameter data previously stored in its memory to check whether pulling is being effected normally. Detection of the melt surface S and capturing of the body growth section are carried out repeatedly to constantly make corrections of the height Z to the reference height $Z_0$ and corrections of the pulling conditions so that the single crystal Ig may be pulled with a constant diameter. Finally, the tail of the single crystal Ig is formed to complete single crystal production.

The wavelength of the green laser light (490 to 550 nm) from the laser unit 46 does not overlap with that of the light produced from the heater 36 in the chamber vessel 33 irrespective of the brightness (i.e., output) of the heater 36 in every stage of the single crystal growth. The spot p formed by the green laser beam on the melt surface S can be securely sensed with the CCD camera 47 even at a small output of 5 mW or less without interference by the light generated in the furnace.

In general, the melt surface in the stage of stabilization before pulling tends to slope downward to its center due to the centrifugal force produced by the rotation of the quartz glass crucible 34 or the magnetic field applied in a magnetic field applied Czochralski method and, on the other hand, the melt surface in the stage of body growth tends to slope upward to its center probably because of surface tension. In such cases, spots are liable to be formed at positions farther from the single crystal (nearer to the crucible wall) than set in the stabilization stage. It would follow that the spots are not sensed accurately without a considerable correction of the CCD camera angle.

In addition, where the gap between the back side of the horizontal portion of the cylindrical cover and the melt level is 20 mm or smaller, it is necessary that spots be formed at positions not more than 20 mm apart from the single crystal. Because the slope of the melt surface is steeper in the vicinity of the single crystal, the reflection angle of the spot on the melt surface may change, resulting in a failure of accurate image detection.

The above problems can be successfully managed by the abovedescribed second embodiment of the present invention. That is, because a laser beam incident on the top of the light transmitting object forms a virtual image of the light transmitting object on the melt surface at the position right under the light transmitting object, there is little need to adjust the CCD camera even when the melt surface has a slope, and fine adjustment of the CCD camera suffices to cope with the inconveniences described above. Accordingly, even where the gap between the horizontal portion 40s of the cylindrical cover 40 and the melt surface is narrow, it is possible to maintain the spot set in the stabilizing stage also in the body growth stage, enabling accurate image sensing.

Further, since the CCD camera captures the center of the coordinates of the spot p, the spot p can be securely imaged even with a low output of the laser to achieve accurate detection of the melt level. As a result, single crystal pulling can be conducted while maintaining the melt surface on the optimum level to produce a high-quality single crystal.

EXAMPLE

An 8-in. silicon single crystal was pulled by use of the apparatus shown in FIG. 1. The emission spectrum of the light generated in the furnace during the step of body pulling and the green laser beam emitted from the laser having an output of 3 mW was determined.

As shown in FIG. 11, the green laser beam shows a clearly distinguishable intensity peak out of the range of the light generated in the furnace notwithstanding its low output. The spots formed on the melt surface were securely imaged by the CCD camera.

According to the apparatus and the method of the present invention, a spot for detection is formed on the melt surface and accurately imaged without being influenced by the brightness in the chamber vessel, i.e., the heater power situation. This secures highly accurate automatic melt level control in every stage of single crystal pulling to guarantee high quality of the single crystal produced. Additionally, the apparatus and the method of the invention are safe to operators and easy to operate.

More specifically, in the first aspect of the invention, the apparatus has a laser emitting a beam of 550 nm or less to form a spot on the melt surface, an image capturing unit for capturing the spot to furnish image signals, a control unit receiving the image signals from the image capturing unit, as binalized and processed by an image processing means, and a crucible shaft lift which lifts a crucible shaft under instructions from the control unit to adjust the melt level. Therefore, a spot formed on the melt surface by a laser beam, even with a small output, can securely be sensed without interference by the light generated in the furnace. Further, a laser having a low output is small, safe, and easy to handle.

In the second aspect of the invention, the apparatus has a cylindrical cover composed of a cylindrical body portion having an upper and a lower opening for letting a growing single crystal pass through and a horizontal portion which extends from the lower end of the body portion in the radial direction either inwardly or outwardly and faces the melt with a gap therebetween. A laser beam illuminating the melt surface is reflected on the melt surface to form a spot on the back side of the horizontal portion. The spot on the horizontal portion is further reflected to form a spot on the melt surface, which can securely be sensed with no interference by the light generated in the chamber vessel even in using a low output laser.

Where a laser beam from the laser illuminates a light transmitting object provided between the laser and the melt level to form a spot as a virtual image on the melt surface, the spot can securely be sensed even when the melt surface has a slight slope.

Since the light transmitting object is provided in the horizontal portion of the cylindrical cover, even where the gap between the horizontal portion and the melt surface is narrow, it is possible to maintain the spot as set in the stabilizing stage during the body growth stage, enabling accurate image sensing.

Green or blue laser light used in the present invention can form a spot that is securely imaged on the melt surface even with a low output.

Since the melt level control system comprising the image capturing unit, the image processing means, and the control unit also serves for crystal diameter control, the apparatus of the present invention is inexpensive.

Brief Description of the Drawings

What is claimed is:

1. A single crystal pulling apparatus comprising a quartz glass crucible provided in a chamber vessel and a heater for heating a polycrystalline silicon put in the crucible to produce a melt, in which a seed crystal is dipped and lifted to pull a single crystal, said apparatus having a laser unit which emits a beam having a wavelength of 550 nm or less to form a spot on the surface of said melt, an image capturing unit for capturing said spot to produce image signals, a control unit which receives the image signals as binalized and processed by an image processing means, and a crucible shaft lift which lifts a crucible shaft under instructions from the control unit to adjust the melt level.

2. The single crystal pulling apparatus as claimed in claim 1, wherein said laser beam illuminates a light transmitting object provided between said laser unit and the melt level to form a spot as a virtual image on the melt surface.

3. The single crystal pulling apparatus as claimed in claim 2, wherein said light transmitting object is provided in a horizontal portion of a cylindrical cover.

4. The single crystal pulling apparatus as claimed in claim 3, wherein said laser beam is a green laser beam or a blue laser beam.

5. The single crystal pulling apparatus as claimed in claim 1, wherein said image capturing unit, said image processing means, and said control unit also used for automatic diameter control.

6. A single crystal pulling apparatus comprising a quartz glass crucible provided in a chamber vessel and a heater for heating a polycrystalline silicon put in the crucible to produce a melt, in which a seed crystal is dipped and lifted to pull a single crystal, said apparatus having a cylindrical cover placed above said crucible to surround a growing single crystal, a laser unit which emits a beam having a wavelength of 550 nm or less to form a spot on the surface of said melt, an image capturing unit for forming an image of said spot to produce image signals, a control unit which receives the image signals as binalized and processed by an image processing means, and a crucible shaft lift which lifts a crucible shaft under instructions from said control unit to adjust the melt level, said cylindrical cover being composed of a cylindrical body portion having an upper and a lower opening for letting a growing single crystal pass through and a horizontal portion which extends from the lower end of said body portion in the radial direction either inwardly or outwardly and faces said melt with a gap therebetween.

7. The single crystal pulling apparatus as claimed in claim 6, wherein said laser beam illuminates a light transmitting object provided between said laser unit and the melt level to form a spot as a virtual image on the melt surface.

8. The single crystal pulling apparatus as claimed in claim 7, wherein said light transmitting object is provided in a horizontal portion of a cylindrical cover.

9. The single crystal pulling apparatus as claimed in claim 6, wherein said image capturing unit, said image processing means, and said control unit also used for automatic diameter control.

10. A single crystal pulling method comprising charging a semiconductor raw material into a quartz glass crucible that can be lifted in a chamber vessel, heating said raw material into a melt, dipping a seed crystal in said melt, and lifting said seed crystal to pull a single crystal, wherein a spot for melt level detection is formed on the surface of said melt by a laser beam having a wavelength of 550 nm or less, said spot is captured to produce image signals, which are binalized and processed into melt level data, and said quartz glass crucible is lifted based on said melt level data to control the melt level.

11. The single crystal pulling method as claimed in claim 10, wherein said laser beam illuminates a light transmitting object provided in the path of said laser beam to form a spot as a virtual image on the melt surface.

12. A single crystal pulling method comprising charging a polycrystalline silicon into a quartz glass crucible that can be lifted in a chamber vessel, heating the polycrystalline silicon into a melt, pulling down a seed crystal through a hole of a cylindrical cover disposed above the crucible, dipping the seed crystal in the melt, and lifting the seed crystal to pull a single crystal, wherein a laser beam having a wavelength of 550 nm or less is projected to the melt surface and reflected on the melt surface to form a spot on the back side of a horizontal portion extending from a lower end of said cylindrical cover, said spot is captured to produce image signals, which are binalized and processed into melt level data, and said quartz glass crucible is lifted based on said melt level data to control the melt level.

\* \* \* \* \*